(12) United States Patent
Rhim et al.

(10) Patent No.: US 7,573,181 B2
(45) Date of Patent: Aug. 11, 2009

(54) MULTILAYER ULTRASONIC TRANSDUCER AND METHOD FOR MANUFACTURING SAME

(75) Inventors: Sung Min Rhim, Siheung-si (KR); Ho Jung, Seoul (KR)

(73) Assignee: Humanscan Co., Ltd. (KR)

( * ) Notice: Subject to any disclaimer, the term of this patent is extended or adjusted under 35 U.S.C. 154(b) by 0 days.

(21) Appl. No.: 11/816,609

(22) PCT Filed: Dec. 8, 2005

(86) PCT No.: PCT/KR2005/004190

§ 371 (c)(1),
(2), (4) Date: Aug. 17, 2007

(87) PCT Pub. No.: WO2006/090969

PCT Pub. Date: Aug. 31, 2006

(65) Prior Publication Data

US 2008/0018205 A1    Jan. 24, 2008

(30) Foreign Application Priority Data

Feb. 22, 2005   (KR) ...................... 10-2005-0014314

(51) Int. Cl.
*H01L 41/083* (2006.01)

(52) U.S. Cl. ...................................................... 310/328

(58) Field of Classification Search ................. 310/328, 310/334; 600/459; 29/25.35
See application file for complete search history.

(56) References Cited

U.S. PATENT DOCUMENTS

| | | | | |
|---|---|---|---|---|
| 5,617,865 | A * | 4/1997 | Palczewska et al. | 600/459 |
| 6,121,718 | A * | 9/2000 | Mohr, III | 310/334 |
| 6,515,403 | B1 * | 2/2003 | Schober et al. | 310/328 |
| 6,552,471 | B1 * | 4/2003 | Chandran et al. | 310/328 |
| 6,996,883 | B2 * | 2/2006 | Chandran et al. | 29/25.35 |

* cited by examiner

*Primary Examiner*—Jaydi SanMartin
(74) *Attorney, Agent, or Firm*—Baker & Hostetler, LLP (57) ABSTRACT

A multilayer ultrasonic transducer includes a multilayer piezoelectric substrate assembly (100) laminated with a first and a second piezoelectric substrate on top of each other, and having a first electrode node (42) and a second electrode (44) node polarized with a primary electrode and a secondary electrode, respectively, a flexible printed circuit board coupled to the first electrode node, a backing block with a predetermined thickness surrounded by the flexible printed circuit board, a ground flexible printed circuit board coupled to the second electrode node, and an acoustic matching layer deposited on the multilayer piezoelectric substrate assembly.

20 Claims, 11 Drawing Sheets

MULTILAYER ULTRASONIC TRANSDUCER AND METHOD FOR MANUFACTURING SAME

TECHNICAL FIELD

The present invention relates to a multilayer ultrasonic transducer and a method for the manufacture thereof; and, more particularly, to a multilayer ultrasonic transducer with an improved vibration feature and a method for the manufacture thereof.

BACKGROUND ART

Ultrasonic transducers for medical imaging have many components, and pitches among the components are getting smaller. As the dimensions of the components in an ultrasonic transducer decrease, a mismatch of electrical impedance between an ultrasonic image diagnostic system the ultrasonic transducer and an ultrasonic image diagnostic system is rising as a serious problem yet to be solved.

In general, electrical impedance of the components in an ultrasonic transducer ranges from 100 ohms to 500 ohms while electrical impedance of typical cables used to communicate between the ultrasonic transducer and the ultrasonic image diagnostic system ranges from 50 ohms to 85 ohms, exhibiting great difference therebetween. Such a mismatch deteriorates an energy transduction efficiency, which in turn results in a deterioration of sensitivity of the transducer and an increase of a signal-to-noise ratio, thereby impeding a signal processing for the representation of an ultrasonic image. The most important factors in ultrasonic image diagnosis are brightness and resolution of the image. However, the mismatch of the electrical impedance between the ultrasonic transducer and the ultrasonic image diagnostic system hinders the representation of a bright image.

In case piezoelectric substrates of same thicknesses are connected to each other in series acoustically but in parallel elastically, a relationship between voltage, impedance and the number of the piezoelectric substrates can be expressed as follows (see, Michael Greenstein and Umesh Kumar, "Multilayer piezoelectrical resonators for medical ultrasound transducer", IEEE Transactions Ultrasonics, Ferroelectrics and Frequency Control, vol. 43, pp. 622-624, 1996):

$$V(N)=V(1)/N$$

$$Z(N)=Z(1)/N^2$$

where N, V, and Z represent the number of the wafers, voltage and impedance, respectively.

That is, as the number of the piezoelectric substrates increases, the impedance decreases in proportion to the square of N. Thus, by reducing the high impedance of the transducer's components based on this principle, it is likely that the above-mentioned mismatch problem would be solved.

In this regard, there have been made many attempts to apply a multilayer piezoelectric transducer to a medical ultrasonic transducer (see, David M. Mill et al., "Multi-layered PZT-Polymer Composites to increase signal to noise ratio and resolution for medial ultrasound transducer", IEEE transactions on ultrasonics, ferro-electrics, and frequency control, Vol. 46, No. 4, July 1999).

Such a multilayer piezoelectric ultrasonic transducer as mentioned above, however, has a drawback in that it has a poor vibration feature because an additional layer besides a matching layer is coupled to a front surface of the transducer. For example, U.S. Pat. Nos. 6,121,718 and 6,437,487 disclose multiplayer ultrasonic transducers using piezoelectric materials, wherein FPCBs (Flexible Printed Circuit Boards) are formed on both the front and the rear surface of a stacked assembly for electrical connection. Therefore, the stacked assembly has a configuration in which a FPCB formed of a polyimide/Cu layer of several tens of microns or a Cu layer of several tens of microns is deposited on the front surface of the multilayer transducer. As a consequence, the vibration feature of the stacked assembly becomes poor.

DISCLOSURE OF INVENTION

Technical Problem

It is, therefore, an object of the present invention to provide a multilayer piezoelectric substrate assembly for use in an ultrasonic transducer and the method of fabricating thereof.

Another object of the present invention is to provide a multilayer ultrasonic transducer with an improved vibration feature employing the multilayer piezoelectric substrate assembly and a method of fabricating thereof.

Technical Solution

In accordance with a first aspect of the present invention, there is provided a multilayer piezoelectric substrate assembly, comprising: a first piezoelectric substrate having a first electrode layer formed on a first and a second main surface and a first and a second side surface thereof, the first piezoelectric substrate having a first and a second discontinuity on the first and the second main surface to divide the first electrode layer into a first electrode and a second electrode isolated from each other; and a second piezoelectric substrate having a second electrode layer formed on a first and a second main surface and a first and a second side surface thereof, the second piezoelectric substrate having a third and a fourth discontinuity to divide the second electrode layer into a third and a fourth electrode isolated from each other, the first discontinuity being formed on the first main surface, wherein the first and the second piezoelectric substrates are coupled each other such that the second and the third discontinuities are faced each other, to thereby form a first electrode node and a second electrode node, the first electrode node having the first and the third electrodes and the second electrode node having the second and the fourth electrodes.

In accordance with a second aspect of the present invention, there is provided a multilayer ultrasonic transducer including the multilayer piezoelectric substrate assembly as described above.

In accordance with a third aspect of the present invention, there is provided a method for fabricating a multilayer piezoelectric substrate assembly comprising the steps of: preparing a first and a second piezoelectric substrate having electrode layers of conductive materials deposited thereon, respectively; forming a first and a second discontinuity and a third and a fourth discontinuity on a top and a bottom surface of the first and the second piezoelectric substrates to divide the electrode layers into a first and a second electrode and a third and a fourth electrode isolated from each other, respectively; and laminating the first and the second piezoelectric substrates on top of each other by allowing the second discontinuity of the first piezoelectric substrate to face the third discontinuity of the second piezoelectric substrate, to thereby form a first electrode node having the first and the third electrode being coupled to each other and a second electrode node having the second and the fourth electrode being coupled to each other.

In accordance with a fourth aspect of the present invention, there is provided a method for fabricating a multilayer ultrasonic transducer including the multilayer piezoelectric substrate assembly fabricated by the steps as described above.

Advantageous Effects

As described, the technical feature of the present invention resides in that the separation of the electrodes can be achieved by forming the discontinuities and abrading the edge portion in fabricating the multilayer piezoelectric substrate assembly for use in manufacturing the multilayer ultrasonic transducer in accordance with the present invention. By using the multilayer substrate assembly with such a configuration, the ground flexible printed circuit board is coupled to the multilayer piezoelectric substrate assembly by using only the edge portion and the side surface of the electrode, which allows omitting an additional layer to be deposited between the front surface of the multilayer piezoelectric substrate assembly and the matching layer. As a result, it is possible to provide the multilayer ultrasonic transducer with an improved vibration feature, a wide bandwidth and a high sensitivity.

The method of fabricating the multilayer piezoelectric substrate assembly in accordance with the present invention can be used in case of using piezoelectric single crystals as well as using piezoelectric ceramics. Conventionally, an ultrasonic transducer using a piezoelectric single crystalline has a bandwidth 40% to 50% greater than that of a conventional one using a piezoelectric ceramic such as PZT and is capable of realizing a high resolution in an ultrasonic image diagnosis. However, the ultrasonic transducer using the piezoelectric single crystalline substrate also has the same problem as in the one using the piezoelectric ceramic substrate in that the mismatching between the components of the transducer and the system is great, so it is difficult to improve sensitivity and an S/N ratio of the transducer. Further, since the piezoelectric single crystalline substrate is very weak mechanically and thermally, it is readily destroyed during a machining process including grinding, lapping, dicing steps and a transducer manufacturing process involving a bonding step, etc. In accordance with the present invention, however, no layer exists on the front surface of the transducer, so the conventional problem of the reduction in sensitivity can be solved, and the probability of the piezoelectric single crystalline substrate being broken during the manufacturing process, for the separation of the electrodes is done in a simple way such as an edge abrasion.

Piezoelectric elements formed of piezoelectric single crystals in accordance with the present invention provides a higher permittivity compared to piezoelectric elements formed of PZT type ceramics that are common in the art. Therefore, by using the piezoelectric elements formed of piezoelectric single crystals in accordance with the present invention, a loss of a cable or an equipment caused by a stray capacitance thereof can be reduced, which makes it possible to obtain a high-sensitivity signal.

BRIEF DESCRIPTION OF THE DRAWINGS

The above and other objects and features of the present invention will become apparent from the following description of preferred embodiments given in conjunction with the accompanying drawings, in which.

BEST MODE FOR CARRYING OUT THE INVENTION

Hereinafter, preferred embodiments of the present invention will be described with reference to the accompanying drawings.

A multilayer ultrasonic transducer in accordance with the present invention is fabricated through a process sequentially illustrated in FIGS. 1 to 10.

Figure 1:
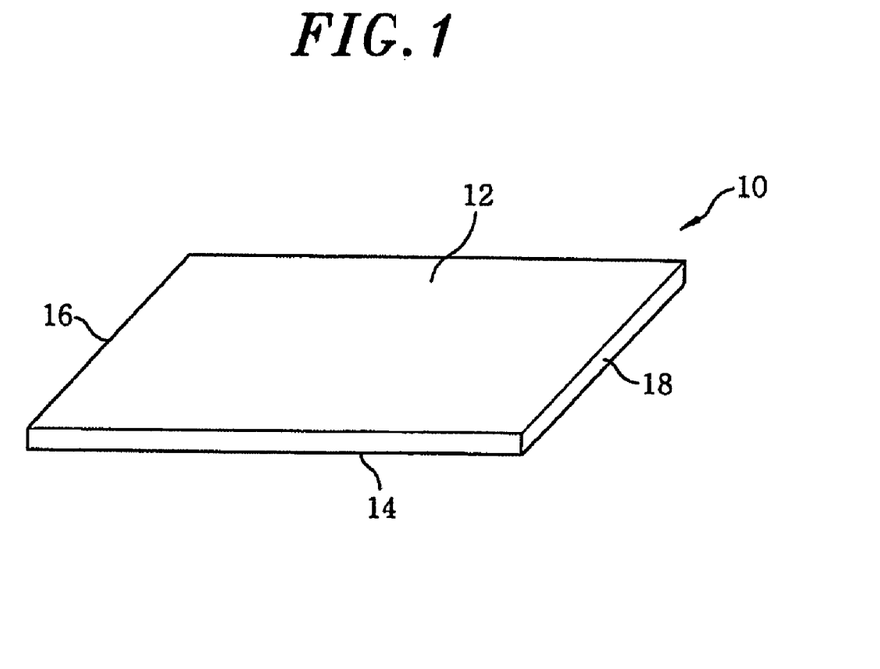
FIGS. 1 to 7 illustrate a sequential process of fabricating a multilayer piezoelectric substrate assembly in accordance with the present invention.

As shown in FIG. 1, first of all, two piezoelectric substrates, only one of them being shown in this drawing for simplicity, are prepared. Although there is shown and described that two piezoelectric substrates are used in this embodiment, it is also possible to use more than two piezoelectric substrates, to thereby fabricate a multilayer ultrasonic transducer with three or more substrate s layers if necessary. These piezoelectric substrates are employed to vibrate when applying alternating current (AC) thereto to generate ultrasonic signals in the ultrasonic transducer. A first piezoelectric substrate 10 has a first main (or a top) surface 12, a second main (or a bottom) surface 14, a first (or a left) side surface 16 and a second (or a right) side surface 18.

Figure 2:
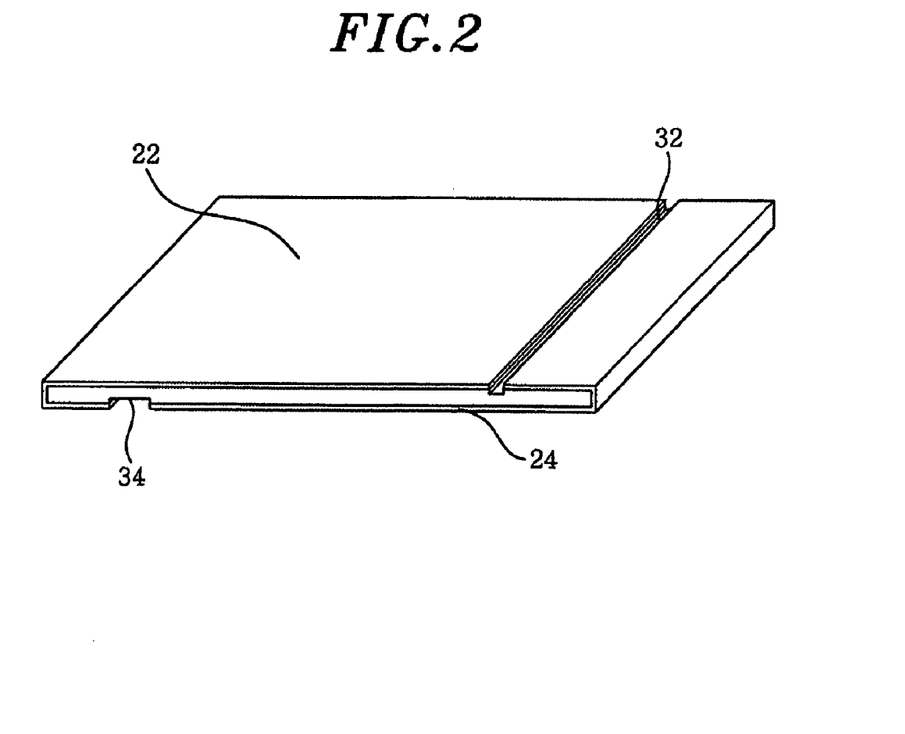

Then, as illustrated in FIG. 2, an electrode layer 21 of an electrical conductive material is evenly deposited on each of the four surfaces 12 to 18 of a first piezoelectric substrate 10 by employing a sputtering, an electronic beam, a thermal evaporation or an electro plating method. Subsequently, first and second discontinuities 32 and 34 are formed on the first and the second main surfaces 12 and 14 of the first piezoelectric substrate 10 such that they are elongated along a lengthwise direction of the first and the second side surfaces 16 and 18, respectively. By forming the first and the second discontinuities 32 and 34, the electrode layer 12 is divided into a first and a second electrode 22 and 24 isolated from each other, thus obtaining the first piezoelectric substrate 10 having the two isolated electrodes 22 and 24 formed thereon. The first and the second electrodes 22 and 24 will be served as a primary (minus) electrode and a secondary (plus) electrode, respectively.

The piezoelectric substrate 10 for use in the present invention may be a piezoelectric ceramic substrate or a single crystalline piezoelectric substrate, having a thickness ranging from about 22□ to 500□ and, preferably, ranging from 50□ to 220□.

The electrodes 22 and 24 may be formed of a conductive film made of chrome, copper, nickel, gold, or the like, and the thickness of the electrodes 22 and 24 may range from about 100 Å to 1000 Å.

Such an isolation of the electrode layer 21 can be achieved by forming the discontinuities of certain thickness by using, for example, a dicing saw. Specifically, the first and the second discontinuities 32 and 34 are formed at a predetermined distance from the opposite edges of first and second surfaces 12 and 14 of the first piezoelectric substrate 10, respectively, to thereby divide the electrode layer 12 into (a) the first electrode 22 covering a minority part of the second main surface 14, the first side surface 16 and a majority of the first main surface 12; and (b) the second electrode 24 covering a minority part of the first main surface 12, the second side surface 18 and a majority of the second main surface 14.

The first discontinuity 32 is formed at a position spaced from the right edge of the first main surface 12 of the first piezoelectric substrate 10, wherein the spaced area will be used to accommodate an adhesive for coupling the electrode layer 21 and a ground electrode plate (not shown). For instance, the first discontinuity 32 is preferably formed to have a width of about 0.03 mm to 0.1 mm and formed at a distance about 1 mm to 1.5 mm inward from the right edge of the first main surface 12. Meanwhile, the second discontinuity 34 is preferably formed to have a width of about 0.2 mm to 0.5 mm and formed at a distance 1 mm to 1.5 mm inward from the left edge of the second main surface 14.

According to the present invention, it is preferred that the second discontinuity 34 is formed to be wider than the first discontinuity 32. Further, it is preferable that the first and the second discontinuities 32 and 34 have the depths equivalent to about 70% to 80% of the thickness of the first piezoelectric substrate 10 in order to suppress the generation of vibrations. The adhesive used to couple the electrode layer 21 and the ground electrode plate may be an epoxy paste and, preferably, a silver epoxy paste.

Figure 4:
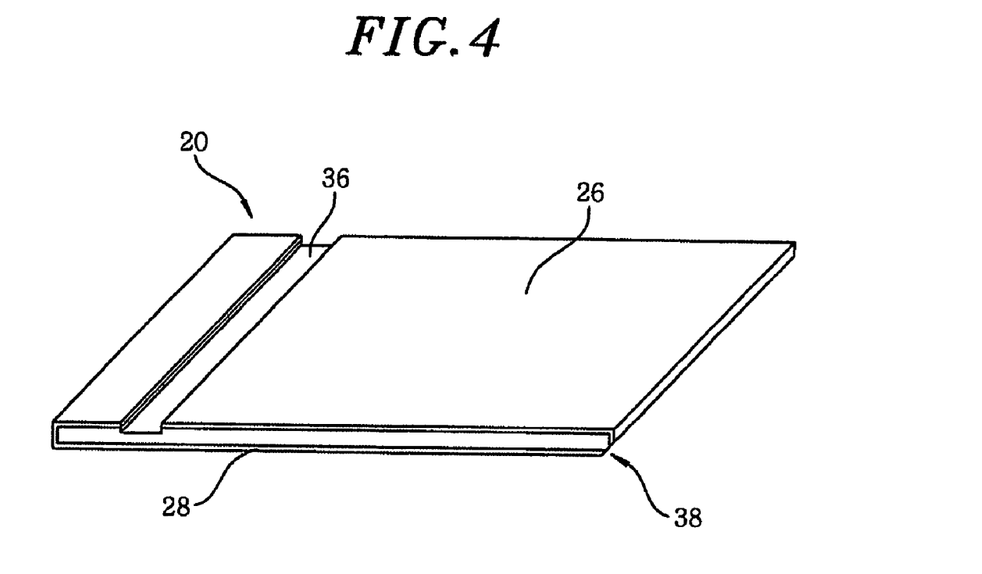

Then, another piezoelectric substrate is prepared and fabricated as follows. As shown in FIG. 4, an electrode layer of an electrical conductive material is deposited on four surfaces of the other one of the two substrates, i.e., a second piezoelectric substrate 20, through the use of the same method as described in FIG. 2, and then a third discontinuity 36 is formed in the electrode layer 21 on a first main surface 12. Further, the electrode layer 21 at an edge portion between a second main surface 14 and a second side surface 18 is abraded along the lengthwise direction of the second side surface, thus forming an edge discontinuity 38. As similar as described above, therefore, the electrode layer is divided into a third and a fourth electrodes 26 and 28 isolated with each other, to thereby obtain the second piezoelectric substrate 20 having the isolated electrodes 26 and 28 formed thereon. The third and the fourth electrodes 26 and 28 will be served as a secondary (plus) and a primary (minus) electrodes, respectively.

More specifically, the third discontinuity 36 is formed on the first main surface of the second piezoelectric substrate 20 such that it is distanced away from the left edge of the first main surface 12 of the second piezoelectric substrate 20, wherein the distance away from the left edge is the same interval as that maintained between the first side surface of the first piezoelectric substrate 10 and the second discontinuity 34 in FIG. 2. Further, the third discontinuity 36 has the same shape as that of the second discontinuity 34, and the edge discontinuity 38 is formed by abrasion.

Figure 6:
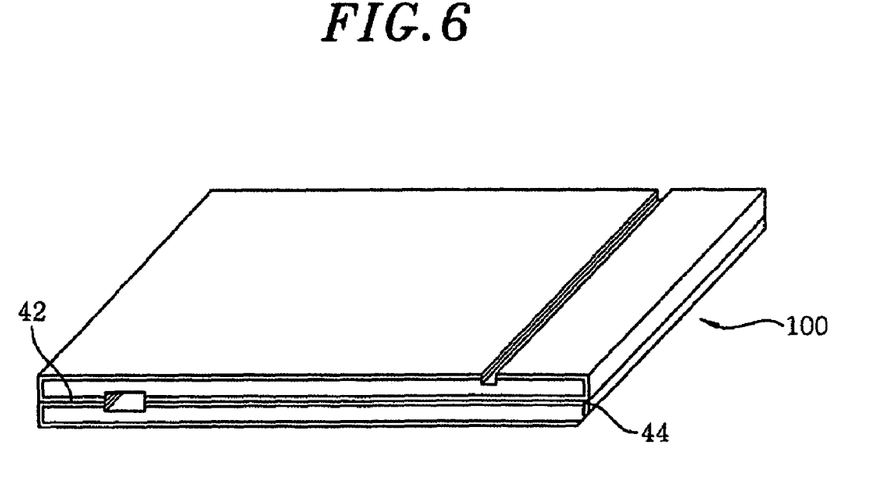
Figure 7:
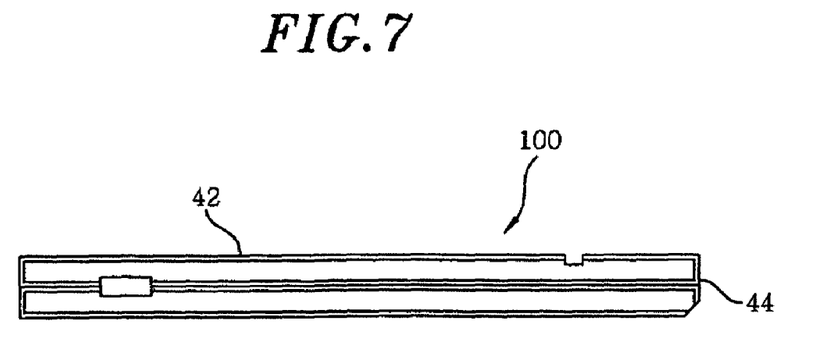

Subsequently, the first and the second piezoelectric substrates 10 and 20 having the electrodes formed thereon as described above are polarized as shown in FIGS. 3 and 5, respectively, so that the first and the fourth electrodes 22 and 28 are polarized as primary (minus) electrodes, while the second and the third electrode 24 and 26 are polarized as secondary (plus) electrodes. Then, the first piezoelectric substrate 10 is joined to the second piezoelectric substrate 20 or vice versa such that the primary electrodes are connected to each other (namely, the second discontinuity 34 and the third discontinuity 36 are adjoined to each other) and the secondary electrodes are connected each other as illustrated in FIGS. 6 and 7, respectively. Accordingly, a first electrode node 42 and a second electrode node 44 are formed, to thereby achieve a multilayer piezoelectric substrate assembly 100.

The joining of the two piezoelectric substrates can be done by using a silver epoxy adhesive well known in the art. Since the second and the third discontinuities 34 and 36 isolate the electrodes by the comparatively wide gap, an occurrence of a short circuit between the primary electrode and the secondary electrode can be prevented even in case the two piezoelectric substrates are dislocated from each other at the time of joining them.

Figure 8:
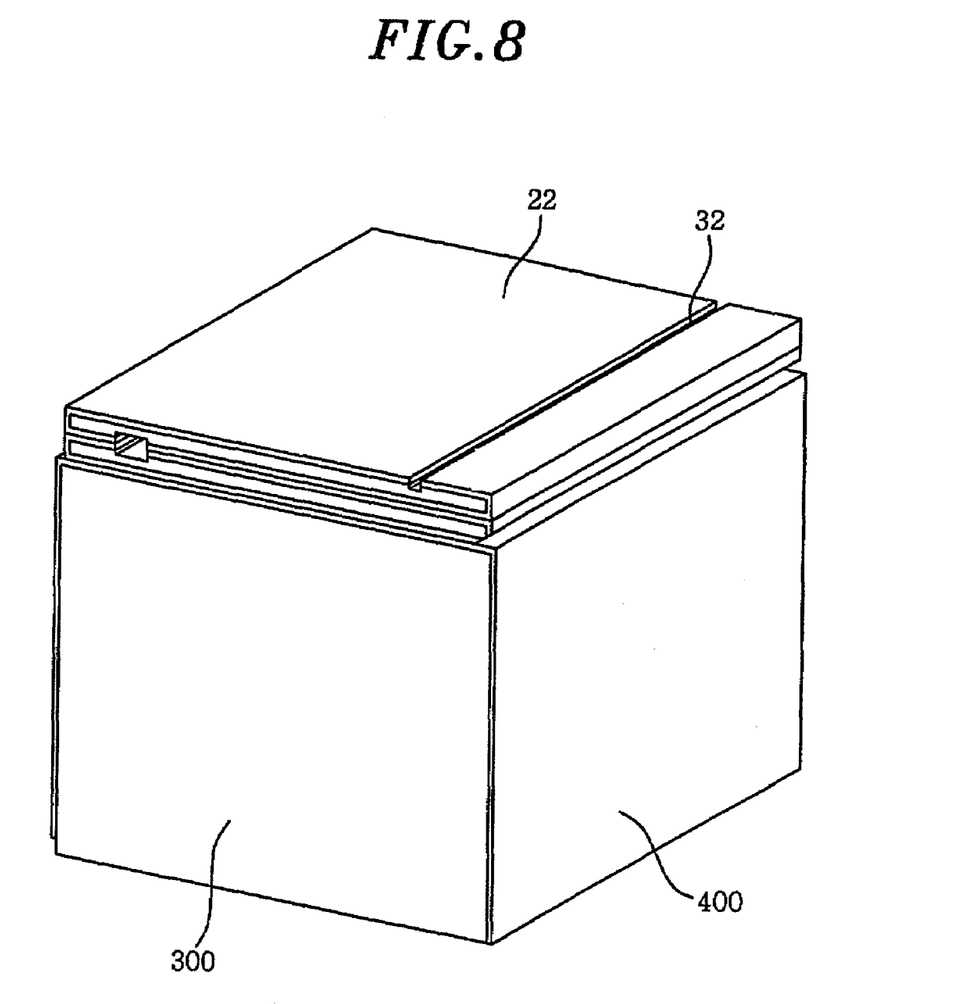
FIGS. 8 to 10 show a sequential process of fabricating a multilayer ultrasonic transducer using the multilayer piezoelectric substrate assembly shown in FIGS. 1 to 7.

After obtaining the multilayer piezoelectric substrate assembly 100, a stapler-shaped thin FPCB(Flexible Printed Circuit Board) 400 for signaling is coupled to the first electrode node 42 on the second main surface of the second piezoelectric substrate 20 and then a backing block 300 is positioned under the FPCB 400 such that a top surface and two opposite side surfaces of the backing block 300 are surrounded by the FPCB 400. The FPCB 400 transmits electric signals to the multilayer piezoelectric substrate assembly 100 and receives ultrasonic signals therefrom. And the backing block 300 functions to absorb the ultrasonic signals to prevent the generation of undesired signals due to the vibration induced by the ultrasonic signals produced by the multilayer piezoelectric substrate assembly 100. In this regard, the FPCB 400 and the backing block 300 may be coupled with each other in advance such that the FPCB 400 surrounds the three surfaces of the backing block 300, and then, the FPCB 400 having the backing block 300 surrounded thereby may be coupled to the first electrode node 42.

Figure 9:
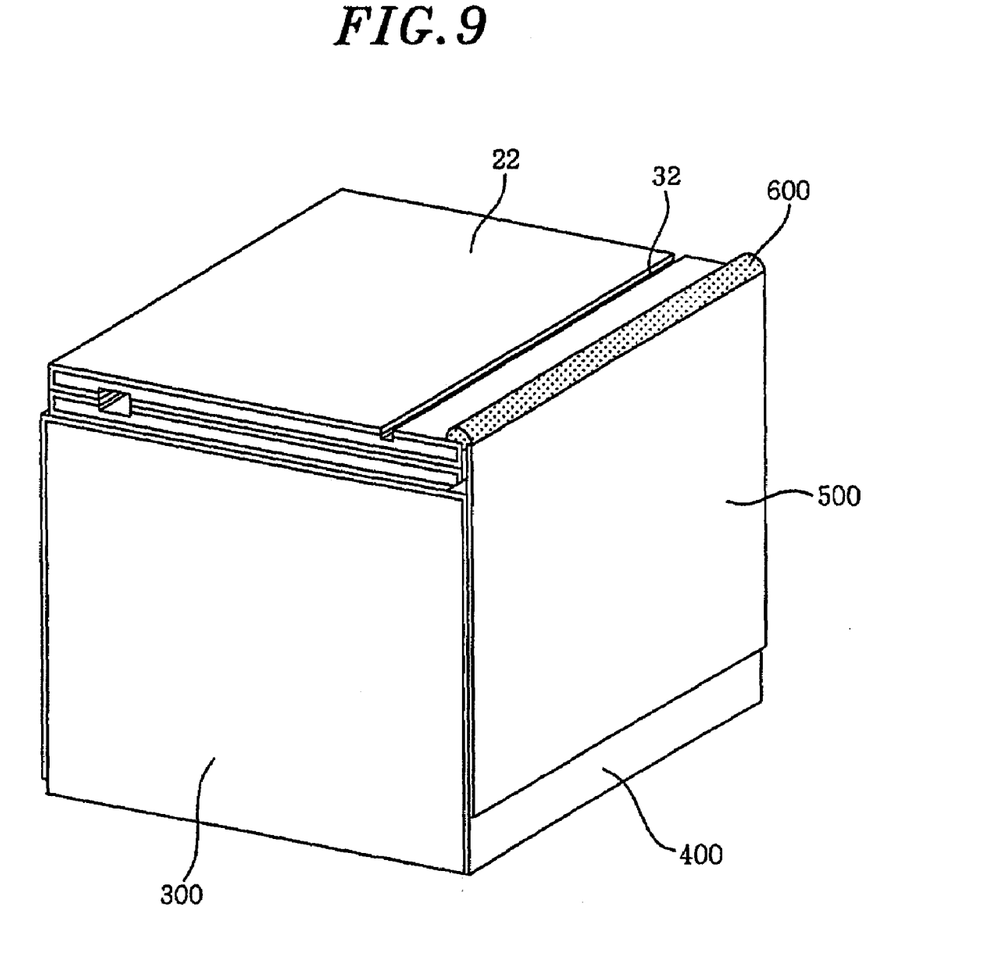

Thereafter, as shown in FIG. 9, a flexible electrode plate 500 for ground is positioned on one of the side surfaces in the vicinity of the first discontinuity 32 and is connected to the second electrode node 44 using a silver epoxy paste 600.

Figure 10:
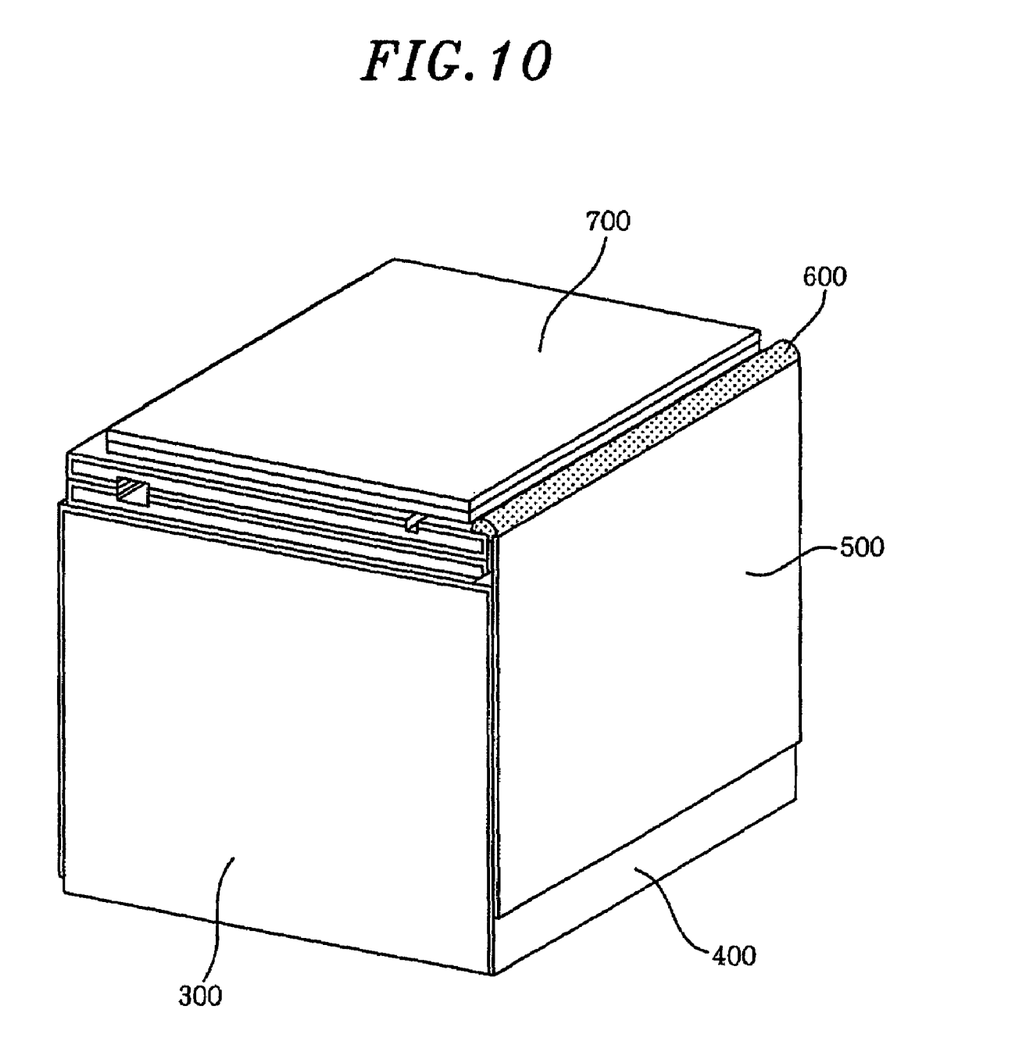

Subsequently, as illustrated in FIG. 10, an acoustic matching layer 700 is coupled on the first electrode node 42 located on the multilayer piezoelectric substrate assembly 100. The acoustic matching layer 700 has a smaller area than that of the multilayer piezoelectric substrate assembly 100 and is arranged on the multilayer piezoelectric substrate assembly 100 while extending somewhat over the second discontinuity 32. The acoustic matching layer 700 serves to match the piezoelectric substrate assembly 100 with a medium, e.g., a human body, so that ultrasonic signals from the piezoelectric substrate assembly 100 are smoothly propagated toward the medium in a desired direction. Then, the acoustic matching layer 700 is covered with an acoustic lens (not shown), to thereby obtain a multilayer ultrasonic transducer. Here, it is possible to stack two or more acoustic matching layers on top of the multilayer laminated piezoelectric substrate assembly 100.

FIG. 8 presents a schematic sectional view of the multilayer ultrasonic transducer shown in FIG. 10. The thus obtained multilayer ultrasonic transducer in accordance with the present invention has an advanced vibration feature, so that it can be applied to various equipments such as a medical ultrasonic diagnostic system and a military/industrial ultrasonic transducer.

Hereinafter, a preferred embodiment of the present invention will be described in detail. Here, it is to be noted that the present invention is not limited thereto.

EXAMPLE

A multilayer ultrasonic transducer in accordance with the preferred embodiment of the present invention was fabricated as follows.

A <001> single crystalline piezoelectric substrate (PMN-(0.3~0.35)) PT having a thickness of about 0.4 mm to 0.5 mm and a size of about 25 mm to 22 mm×about 15 mm to 22 mm was prepared (see, FIG. 1). Then, on a first main surface 12, a second main surface 14, a first side surface 16 and a second side surface 18 of the first piezoelectric substrate 10, an electrode layer 12 of an electrical conductive material was deposited with the thickness ranging from about 1000 Å to 2200 Å by employing an electronic beam deposition method.

Then, another single crystalline piezoelectric substrate having electrodes formed thereon was fabricated by employing the same method as the above, to thereby obtain a second piezoelectric substrate 20.

Subsequently, discontinuities 32 and 34 were formed in the electrode layer on the first and the second main surfaces 12 and 14 of the first piezoelectric substrate 10, respectively, by using a dicing saw, so that the electrode layer was divided into two electrodes 22 and 24 isolated from each other (see, FIG. 2). The discontinuities 32 and 34 were formed about 1 mm to 1.5 mm inward spaced away from the second side surface 18 and the first side surface 16 of the first single piezoelectric substrate 10, respectively, and the depth of each discontinuity was made to be about 0.25 mm to 0.35 mm.

As for the second single piezoelectric substrate 20, a discontinuity 36 was formed in the electrode layer on the first main surface of the second piezoelectric substrate 20 by using the dicing saw, and the electrode layer at the edge portion between the second main surface and the second side surface of the second piezoelectric substrate 20 was removed, so that an edge discontinuity 38 was formed and the electrode layer was divided into two electrodes 26 and 28 (see, FIG. 4). At this time, the discontinuity 36 was formed to have the same shape as that of the discontinuity 34 of the first piezoelectric substrate 10, and the edge discontinuity 38 was formed by abrading the electrode layer at the edge portion between the second main surface and the second side surface of the second piezoelectric substrate 20.

Figure 3:
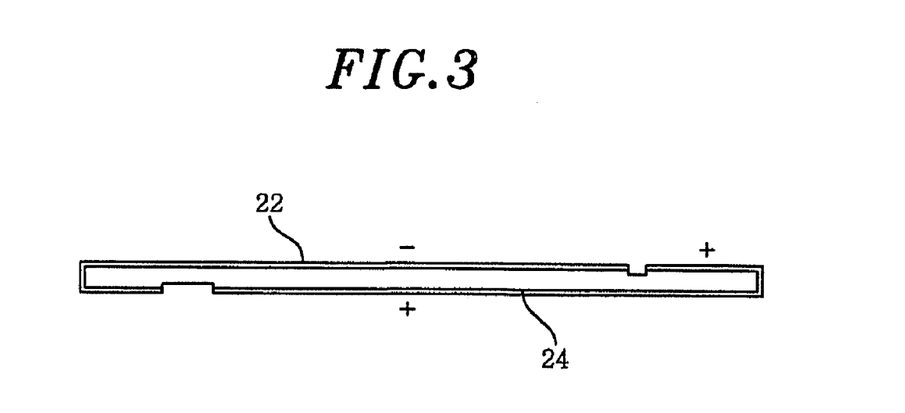
Figure 5:
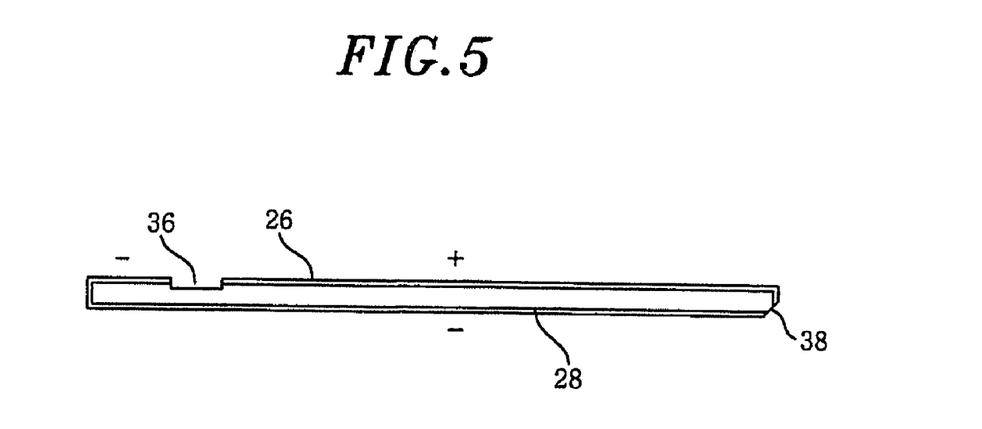

Afterward, the first and the second piezoelectric substrates 10 and 20 were polarized as illustrated in FIGS. 3 and 5, so that the electrodes 22 and 26 were set as primary (minus) electrodes while the electrodes 24 and 28 were configured as secondary (plus) electrodes. Then, the two substrates 10 and 20 were adhered to each other by using a silver epoxy such that the discontinuities 34 and 36 were adjoined to each other while the primary electrodes were joined to each other and the secondary electrodes were joined to each other, as shown in FIGS. 6 and 7, thereby forming a first and a second electrode nodes 42 and 44. As a result, a laminated piezoelectric single crystalline substrate assembly 100 in accordance with the present invention was achieved.

Thereafter, as shown in FIG. 8, a top surface of a FPCB 400, to which a first main surface and two opposite side surfaces of the backing block 300 were coupled in advance, was adjoined to the first electrode node 42 located on the second main surface of the second piezoelectric substrate 20 of the multilayer laminated piezoelectric substrate assembly 100.

Afterward, as shown in FIG. 9, a flexible ground electrode plate 500 is coupled to the second electrode node 44 of the laminated piezoelectric substrate assembly 100 at front side of the first discontinuity 32 using a silver epoxy paste 600. Subsequently, as illustrated in FIG. 10, an acoustic matching layer 700 was formed on the first electrode layer located on the first main surface of the first piezoelectric substrate 10, and then, by covering the acoustic matching layer 700 with an acoustic lens, the multilayer ultrasonic transducer in accordance with the present invention was finally obtained.

Experimental Example

Pulse-echo characteristics were inspected for each of the multilayer ultrasonic transducer according to the present invention; a PZT (Acuson P2-3AC available from Madison Co. Ltd. in Korea) single-layered transducer (Comparative Example 1) as similar as disclosed in U.S. Pat. No. 6,437,487; and a single-layered transducer of a PMN-(0.3~0.35) PT system (Comparative Example 2), and the results were provided in the following Table 1 and in FIGS. 9 to 11.

TABLE 1

| Properties | | Comparative Example 1 (Single-layer PZT) | Comparative Example 2 (Single-layer PMN-PT) | Preferred Embodiment (Multilayer PMN-PT) |
| --- | --- | --- | --- | --- |
| Relative Sensitivity | DB | 0 | +4.1 | +7.8 |
| Central Frequency | MHz | 2.85 | 3.66 | 4.01 |
| −6 dB Bandwidth | % | 60.2 | 107.9 | 101.0 |
| −22 dB Bandwidth | % | 98.7 | 134.7 | 137.4 |

From the table 1, it can be found that the multilayer transducer in accordance with the present invention has a highly improved sensitivity and a larger bandwidth compared to the single-layered PZT or single-layered crystalline piezoelectric transducers.

Figure 11:
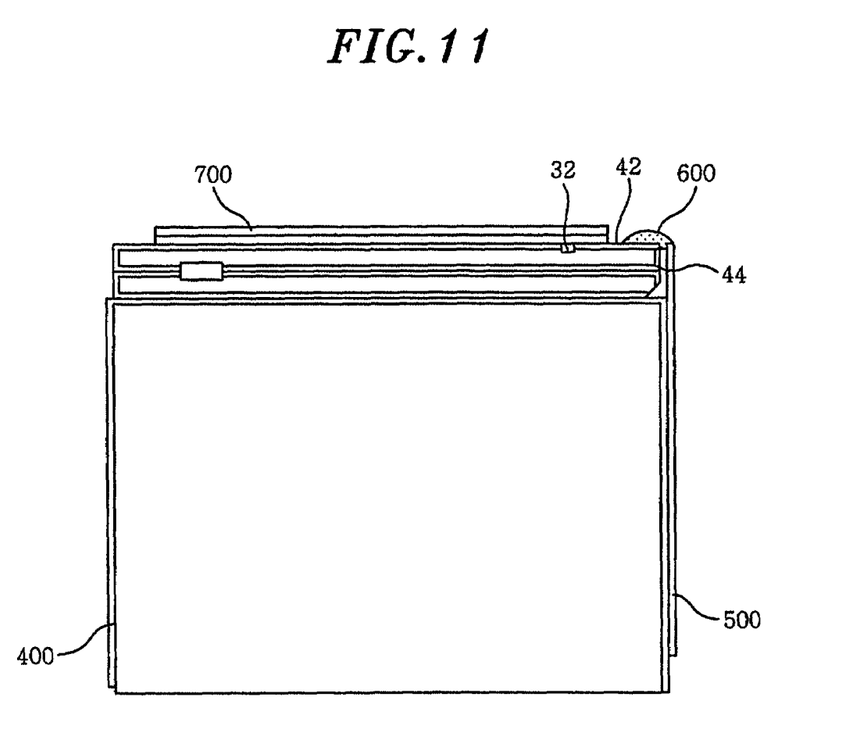
FIG. 11 presents a schematic diagram of the multilayer ultrasonic transducer shown in FIG. 10.
Figure 12:
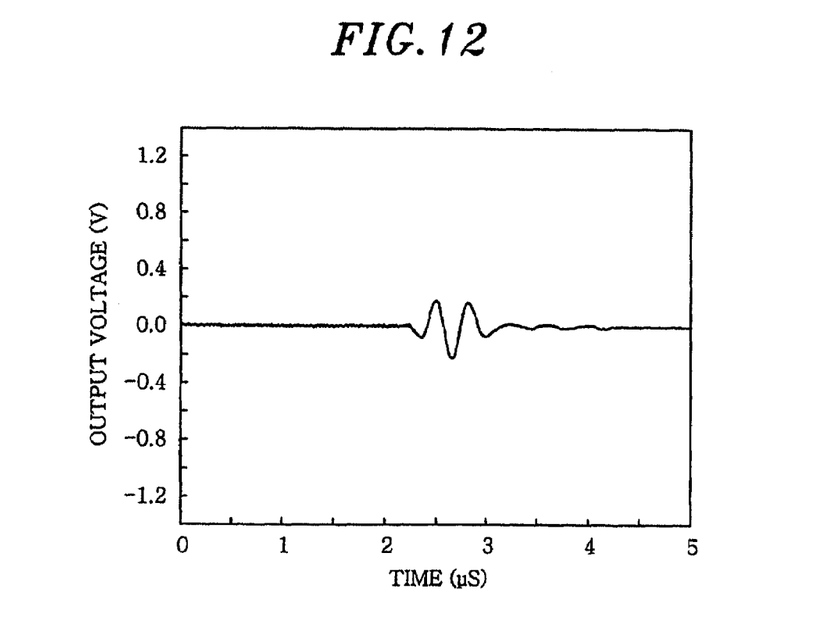
FIGS. 12 and 13 describe a waveform and a frequency spectrum showing a vibration feature of a PZT single-layer transducer, respectively.
Figure 13:
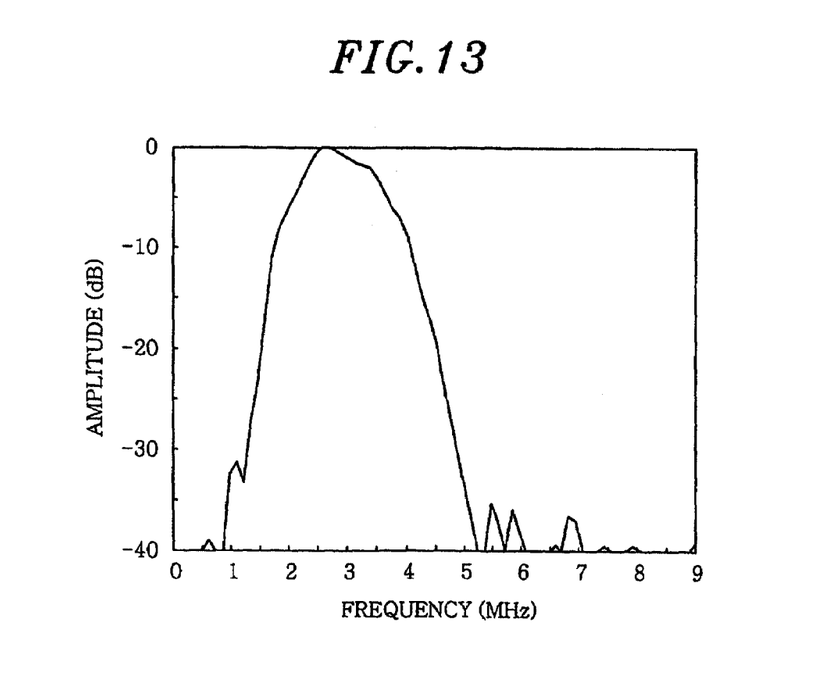
Figure 14:
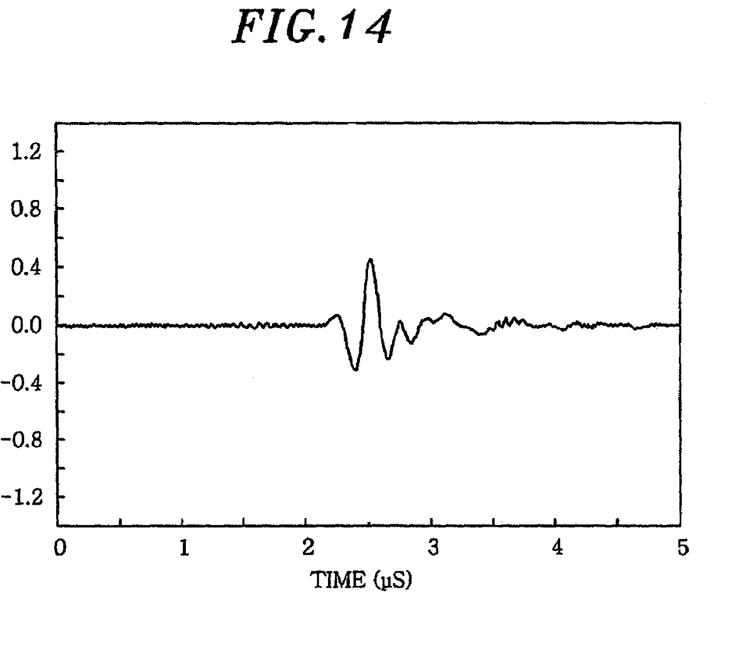
FIGS. 14 and 15 illustrate a waveform and a frequency spectrum showing a vibration feature of a PMN-PT single-layer transducer, respectively.
Figure 15:
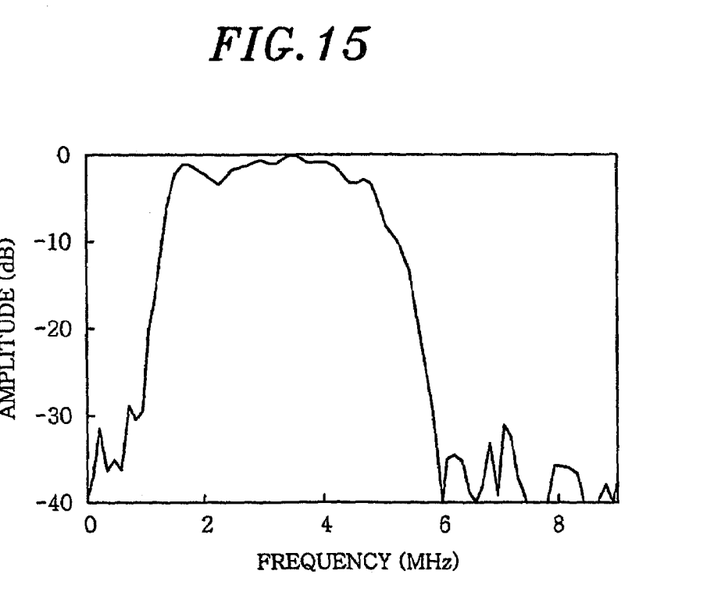
Figure 16:
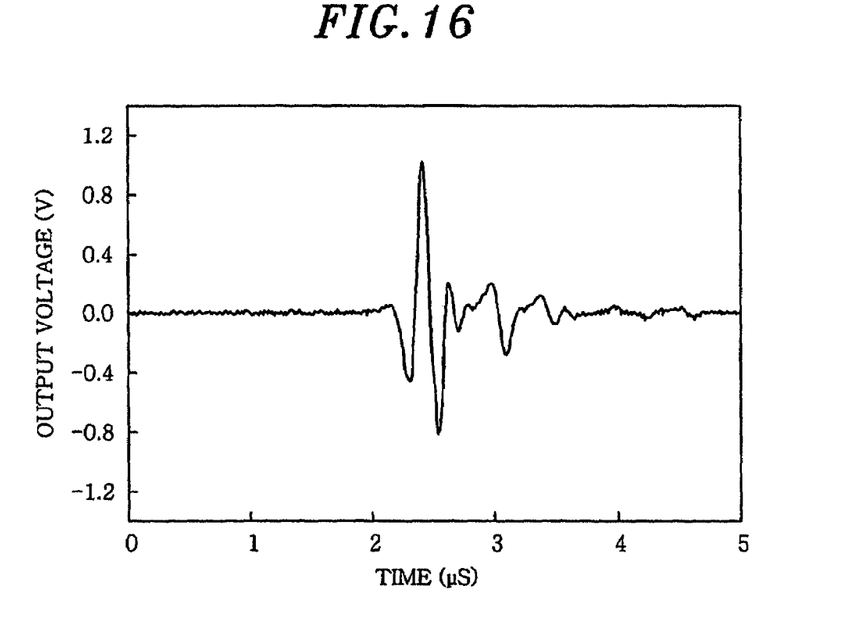
FIGS. 16 and 17 demonstrate a waveform and a frequency spectrum showing a vibration feature of a multilayer ultrasonic transducer in accordance with the present invention.
Figure 17:
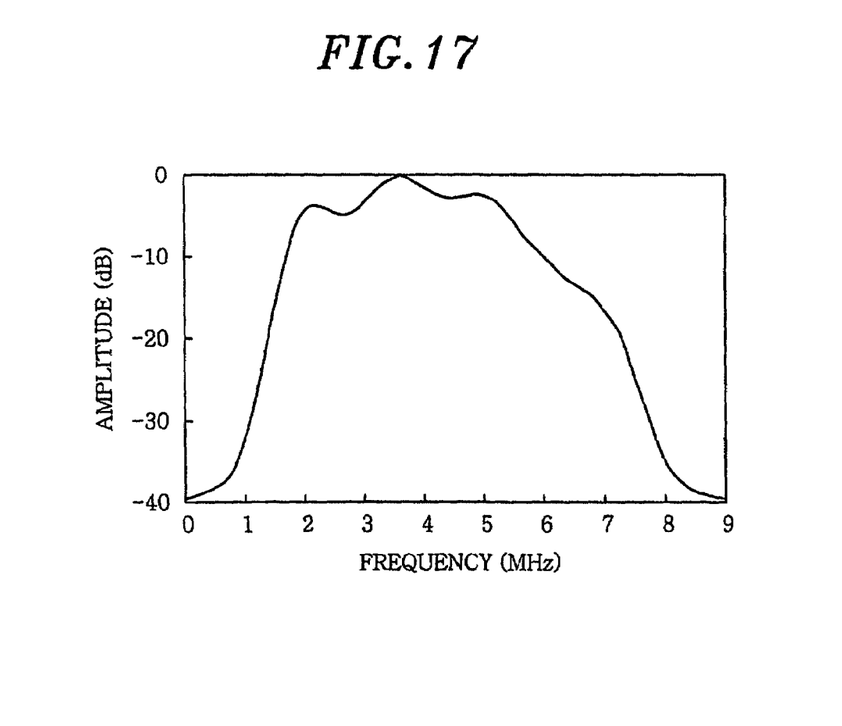

Furthermore, by comparing FIGS. 9 to 11, the sensitivity of the multilayer piezoelectric transducer in accordance with the present invention is found to be higher than those of the single-layered transducers more than 4 dB.

As described above, the multilayer ultrasonic transducer in accordance with the present invention is fabricated by stacking a plurality of piezoelectric materials while forming electrodes in a novel configuration. Thus, the multilayer ultrasonic transducer has an improved vibration feature, a wide bandwidth and a high sensitivity.

While the invention has been shown and descried with respect to the preferred embodiments, it will be understood by those skilled in the art that various changes and modifications may be made without departing from the spirit and scope of the invention as defined in the following claims.

The invention claimed is:

1. A multilayer piezoelectric substrate assembly, comprising:

a first piezoelectric substrate having a first electrode layer formed on a first and a second main surface and a first and a second side surface thereof, the first piezoelectric substrate having a first and a second discontinuity on the first and the second main surface to divide the first electrode layer into a first electrode and a second electrode isolated from each other; and a second piezoelectric substrate having a second electrode layer formed on a first and a second main surface and a first and a second side surface thereof, the second piezoelectric substrate having a third and a fourth discontinuity to divide the second electrode layer into a third and a fourth electrode isolated from each other, the third discontinuity being formed on the first main surface, with the fourth discontinuity being an abraded edge portion, wherein the first and the second piezoelectric substrates are coupled each other such that the second and the third discontinuities are faced each other, to thereby form a first electrode node and a second electrode node, the first electrode node having the first and the third electrodes and the second electrode node having the second and the fourth electrodes.

2. The multilayer piezoelectric substrate assembly of claim 1, wherein each of the first and the second piezoelectric substrate includes a single crystalline piezoelectric substrate.

3. The multilayer piezoelectric substrate assembly of claim 1, wherein each of the first and the second piezoelectric substrate includes a piezoelectric ceramic substrate.

4. The multilayer piezoelectric substrate assembly of claim 1, wherein each of the first to the third discontinuity is formed to have a depth equivalent to about 70% to 80% of a thickness of a substrate on which said each of the first to the third discontinuity is formed.

5. The multilayer piezoelectric substrate assembly of claim 1, wherein the fourth discontinuity is formed between the second main surface and the second side surface of the second piezoelectric substrate.

6. The multilayer piezoelectric substrate assembly of claim 1, wherein the width of the second discontinuity is larger than that of the first discontinuity and substantially identical to that of the third discontinuity.

7. The multilayer piezoelectric substrate assembly of claim 6, wherein the widths of the second and the third discontinuity are set to range from about 0.2 mm to 0.5 mm while the width of the first discontinuity is set to range from about 0.03 mm to 0.1 mm.

8. The multilayer piezoelectric substrate assembly of claim 1, wherein both the first and the second discontinuity are formed about 1 mm to 1.5 mm inward from the first and the second side surface of the first piezoelectric substrate, respectively, while the third discontinuity is formed about 1 mm to 1.5 mm inward from the first side surface of the second piezoelectric substrate.

9. A multilayer ultrasonic transducer comprising the multilayer piezoelectric substrate assembly of claim 1.

10. A method for fabricating a multilayer piezoelectric substrate assembly comprising the steps of:
preparing a first and a second piezoelectric substrate having electrode layers of conductive materials deposited thereon, respectively;
forming a first and a second discontinuity and a third and a fourth discontinuity on a top and a bottom surface of the first and the second piezoelectric substrates to divide the electrode layers into a first and a second electrode and a third and a fourth electrode isolated from each other, respectively, with the fourth discontinuity being formed by abrading an edge portion; and
laminating the first and the second piezoelectric substrates on top of each other by allowing the second discontinuity of the first piezoelectric substrate to face the third discontinuity of the second piezoelectric substrate, to thereby form a first electrode node having the first and the third electrode being coupled to each other and a second electrode node having the second and the fourth electrode being coupled to each other.

11. The method of claim 10, further comprising the step of:
polarizing the first and the second substrate to make the first and the second electrode node have different polarity with each other.

12. The method of claim 10, wherein each of the first, the second and the third discontinuities is formed by a dicing saw.

13. The method of claim 10, wherein the fourth discontinuity is formed between the second main surface and the second side surfaces of the second piezoelectric substrate by abrasion.

14. A method for fabricating a multilayer ultrasonic transducer including the multilayer piezoelectric substrate assembly fabricated by the method of claim 10.

15. A multilayer ultrasonic transducer comprising:
a multilayer piezoelectric substrate assembly including:
a first piezoelectric substrate having a first electrode layer formed on a first and a second main surface and a first and a second side surface thereof, the first piezoelectric substrate having a first and a second discontinuity on the first and the second main surface to divide the first electrode layer into a first electrode and a second electrode isolated from each other; and
a second piezoelectric substrate having a second electrode layer formed on a first and a second main surface and a first and a second side surface thereof, the second piezoelectric substrate having a third and a fourth discontinuity to divide the second electrode layer into a third and a fourth electrode isolated from each other, the third discontinuity being formed on the first main surface, wherein the first and the second piezoelectric substrates are coupled each other such that the second and the third discontinuities are faced each other, to thereby form a first electrode node and a second electrode node, the first electrode node having the first and the third electrodes and the second electrode node having the second and the fourth electrodes;
a flexible printed circuit board coupled to the first electrode node;
a backing block surrounded by the flexible printed circuit board;
a ground flexible printed circuit board coupled to the second electrode node; and
an acoustic matching layer deposited on the multilayer piezoelectric substrate assembly.

16. The multilayer ultrasonic transducer of claim 15, wherein each of the first and the second piezoelectric substrate includes a single crystalline piezoelectric substrate.

17. The multilayer ultrasonic transducer of claim 15, wherein each of the first and the second piezoelectric substrate includes a piezoelectric ceramic substrate.

18. The multilayer ultrasonic transducer of claim 15, wherein the fourth discontinuity is formed between the second main surface and the second side surface of the second piezoelectric substrate.

19. The multilayer ultrasonic transducer of claim 15, wherein the width of the second discontinuity is larger than that of the first discontinuity and substantially identical to that of the third discontinuity.

20. A method for fabricating a multilayer ultrasonic transducer including a multilayer piezoelectric substrate assembly,
wherein the multilayer piezoelectric substrate assembly is fabricated by preparing a first and a second piezoelectric substrate having electrode layers of conductive materials deposited thereon, respectively; forming a first and a second discontinuity and a third and a fourth discontinuity on a top and a bottom surface of the first and the second piezoelectric substrates to divide the electrode layers into a first and a second electrode and a third and a fourth electrode isolated from each other, respectively; and laminating the first and the second piezoelectric substrates on top of each other by allowing the second discontinuity of the first piezoelectric substrate to face the third discontinuity of the second piezoelectric substrate, to thereby form a first electrode node having the first and the third electrode being coupled to each other and a second electrode node having the second and the fourth electrode being coupled to each other, and wherein the method comprises the steps of:

coupling a flexible printed circuit board to the first electrode node;

coupling a ground flexible printed circuit board to the second electrode node; and forming an acoustic matching layer on the multilayer piezoelectric substrate assembly.

* * * * *